(12) United States Patent
Bellantoni et al.

(10) Patent No.: US 12,744,496 B2
(45) Date of Patent: Sep. 22, 2026

(54) THERMAL DROOP COMPENSATION IN POWER AMPLIFIERS

(71) Applicant: Qorvo US, Inc., Greensboro, NC (US)

(72) Inventors: John Bellantoni, San Jose, CA (US); Michael Kevin O'Neal, Saratoga, CA (US); Charles Page, Los Gatos, CA (US)

(73) Assignee: Qorvo US, Inc., Greensboro, NC (US)

( * ) Notice: Subject to any disclaimer, the term of this patent is extended or adjusted under 35 U.S.C. 154(b) by 400 days.

(21) Appl. No.: 18/388,595

(22) Filed: Nov. 10, 2023

(65) Prior Publication Data

US 2024/0275337 A1 Aug. 15, 2024

Related U.S. Application Data

(60) Provisional application No. 63/445,041, filed on Feb. 13, 2023.

(51) Int. Cl.
*H03F 1/30* (2006.01)
*H03F 3/24* (2006.01)

(52) U.S. Cl.
CPC ............... *H03F 1/30* (2013.01); *H03F 3/245* (2013.01); *H03F 2200/447* (2013.01); *H03F 2200/451* (2013.01)

(58) Field of Classification Search
CPC .................................... H03F 1/30; H03G 3/30
(Continued)

(56) References Cited

U.S. PATENT DOCUMENTS 4,356,455 A 10/1982 Ozawa et al.
5,917,382 A * 6/1999 Chiozzi .................. H03F 1/523 330/207 P (Continued)

FOREIGN PATENT DOCUMENTS

CN 113271069 A 8/2021
CN 113793870 A 12/2021

(Continued)

OTHER PUBLICATIONS

Extended European Search Report for European Patent Application No. 24157234.6, mailed Jul. 1, 2024, 15 pages.

(Continued)

*Primary Examiner* — Henry Choe
(74) *Attorney, Agent, or Firm* — Withrow & Terranova, P.L.L.C.

(57) ABSTRACT

Systems and methods for thermal droop compensation in power amplifiers are disclosed. In one aspect, a droop compensation circuit is added to a temperature-sensitive active bias circuit in a power amplifier chain. The droop compensation circuit relies on current mirroring to draw a trigger current that may be used by a correction circuit to create an additional bias signal that offsets temperature-induced droop in the power amplifier. Variations contemplate where the bias signal is injected within the power amplifier chain and what form the correction circuit may take (e.g., an attenuator, a variable gain amplifier (VGA), or the like). By compensating for temperature droop in this fashion, rapid pulsing signals that generate rapid pulses of heat may be transmitted across an effectively linear power amplifier chain without having to deal with droop effects.

18 Claims, 11 Drawing Sheets

(58) Field of Classification Search
USPC .................................................. 330/296, 285
See application file for complete search history.

(56) References Cited

U.S. PATENT DOCUMENTS 6,028,472 A * 2/2000 Nagumo .................... B41J 2/45 327/512
6,554,469 B1 4/2003 Thomson et al.
6,922,107 B1 * 7/2005 Green ..................... H03F 1/302 330/296
7,064,614 B2 6/2006 Feng et al.
7,513,585 B2 * 4/2009 Nishida .................... B41J 29/38 347/9
9,059,662 B1 6/2015 Wyse et al.
9,548,701 B2 * 1/2017 Ridgers ..................... H03F 3/19
9,917,563 B2 * 3/2018 Li ........................ H03G 3/3042
10,014,886 B2 7/2018 Whittaker et al.
10,158,327 B2 * 12/2018 Kim ..................... H04B 1/0028
10,305,433 B2 5/2019 Ranta et al.
10,381,990 B2 * 8/2019 Allen .................... H03F 1/0266
10,439,562 B2 10/2019 Tokuda et al.
10,873,308 B2 12/2020 Ranta et al.
2002/0190734 A1 12/2002 Burt et al.
2006/0087377 A1 4/2006 Svechtarov et al.
2007/0236520 A1 * 10/2007 Nishida .................... B41J 29/02 347/9
2007/0290760 A1 12/2007 Yong
2011/0193628 A1 8/2011 Pukhovski et al.
2014/0354350 A1 12/2014 Bowers et al.
2017/0104458 A1 4/2017 Cohen et al.
2018/0294779 A1 * 10/2018 Allen ........................ H03F 3/19
2020/0036403 A1 1/2020 Whittaker et al.
2020/0091874 A1 3/2020 Sasaki et al.
2022/0060160 A1 2/2022 Gruner et al.
2024/0275339 A1 8/2024 Bellantoni et al.

FOREIGN PATENT DOCUMENTS

CN 113992164 A 1/2022
EP 0358352 A2 3/1990
WO 2018160771 A2 9/2018

OTHER PUBLICATIONS

Bachhuber, S. et al., "Bias Circuits for RF Power Amplifiers," TriQuint Semiconductor White Paper, Jul. 19, 2013, 29 pages.
Chengzhan, L. et al., "An On-Chip Temperature Compensation Circuit for InGaP/GaS for HBT RF Power Amplifier," Journal of Semiconductors, vol. 32, No. 3, Mar. 2011, 4 pages.
Jarvinen, E. et al., "Bias Circuits for GaAs HBT Power Amplifiers," 2001 IEEE Mtt-S International Microwave Sympsoium Digest (Cat. No.01CH37157), May 20-24, 2001, Phoenix, AZ, USA, IEEE, 4 pages.
Kobayashi, K.W. et al., "Monolithic GaAs HBT p-i-n diode variable gain amplifiers, attenuators, and switches," IEEE Transactions on Microwave Theory and Techniques, vol. 41, No. 12, Dec. 1993, IEEE, pp. 2295-2302.
Lim, C.-L. et al, "Diode Quad Is Foundation for PIN DiodeAttenuator," Microwaves & RF, May 2006, available from the Internet: [URL: mwrf.com/print/content/21846368], 10 pages.
Qorvo, "QPF4588A: Wi-Fi 6 Front End Module," Data Sheet Brief Rev B, Nov. 2021, Qorvo US, Inc., 2 pages.
Obmann, et al., "A Circuit Technique to Compensage PVT Variations in a 28 nm CMOS Cascode Power Amplifier," German Microwave Conference, Mar. 16, 2015, Numberg, Germany, IMATech e.V., pp. 131-134.

* cited by examiner

THERMAL DROOP COMPENSATION IN POWER AMPLIFIERS

PRIORITY APPLICATION

This application claims the benefit of U.S. Provisional Patent Application Ser. No. 63/445,041, filed on Feb. 13, 2023, entitled, "THERMAL DROOP COMPENSATION IN POWER AMPLIFIERS," the disclosure of which is hereby incorporated herein by reference in its entirety.

BACKGROUND

I. Field of the Disclosure

The technology of the disclosure relates generally to power amplifiers and techniques to compensate for thermal droop thereof.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, the power demands have increased both for the user devices (e.g., smartphones, tablets, laptops) and for the radio nodes that provide wireless connectivity to the user devices. Such increased power demands result in heat dissipating through the devices, regardless of which end of the wireless connection. As the heat dissipates, operating temperatures may rise, causing changes in operation of power amplifiers (i.e., thermal droop). Correcting for thermal droop provides room for innovation.

SUMMARY

Aspects disclosed in the detailed description include systems and methods for thermal droop compensation in power amplifiers. In particular, exemplary aspects of the present disclosure contemplate adding a droop compensation circuit to a temperature-sensitive active bias circuit in a power amplifier chain. The droop compensation circuit relies on current mirroring to draw a trigger current that may be used by a correction circuit to create an additional bias signal that offsets temperature-induced droop in the power amplifier. Variations contemplate where the bias signal is injected within the power amplifier chain and what form the correction circuit may take (e.g., an attenuator, a variable gain amplifier (VGA), or the like). By compensating for temperature droop in this fashion, rapid pulsing signals that generate rapid pulses of heat may be transmitted across an effectively linear power amplifier chain without having to deal with droop effects.

In this regard, in one aspect, an amplifier chain is disclosed. The amplifier chain comprises a power amplifier. The amplifier chain also comprises an active bias circuit coupled to the power amplifier. The active bias circuit comprises a heat-sensitive element. The amplifier chain also comprises a droop circuit coupled to the heat-sensitive element. The droop circuit comprises a current mirror configured to draw current responsive to changes in the heat-sensitive element and generate a trigger signal. The amplifier chain also comprises a correction circuit coupled to the power amplifier and the droop circuit. The correction circuit is configured to receive the trigger signal. The correction circuit is also configured, responsive to receipt of the trigger signal, to provide a thermal droop correction to the power amplifier.

In another aspect, a method of correcting thermal droop in an amplifier chain is disclosed. The method comprises responsive to heat changes in a heat-sensitive element caused by a proximate power amplifier, triggering a current draw in a current mirror. The method also comprises causing an imbalance at an operational amplifier (op-amp). The method also comprises balancing the imbalance by creating a trigger current for a correction circuit.

In another aspect, a wireless communication device is disclosed. The wireless communication device includes an amplifier chain comprising a power amplifier, an active bias circuit coupled to the power amplifier, the active bias circuit comprising a heat-sensitive element, and a droop circuit coupled to the heat-sensitive element, the droop circuit comprising a current mirror configured to draw current responsive to changes in the heat-sensitive element and generate a trigger signal. The active bias circuit further comprising a correction circuit coupled to the power amplifier and the droop circuit and configured to: receive the trigger signal and, responsive to receipt of the trigger signal, provide a thermal droop correction to the power amplifier.

DETAILED DESCRIPTION

Figure 1:
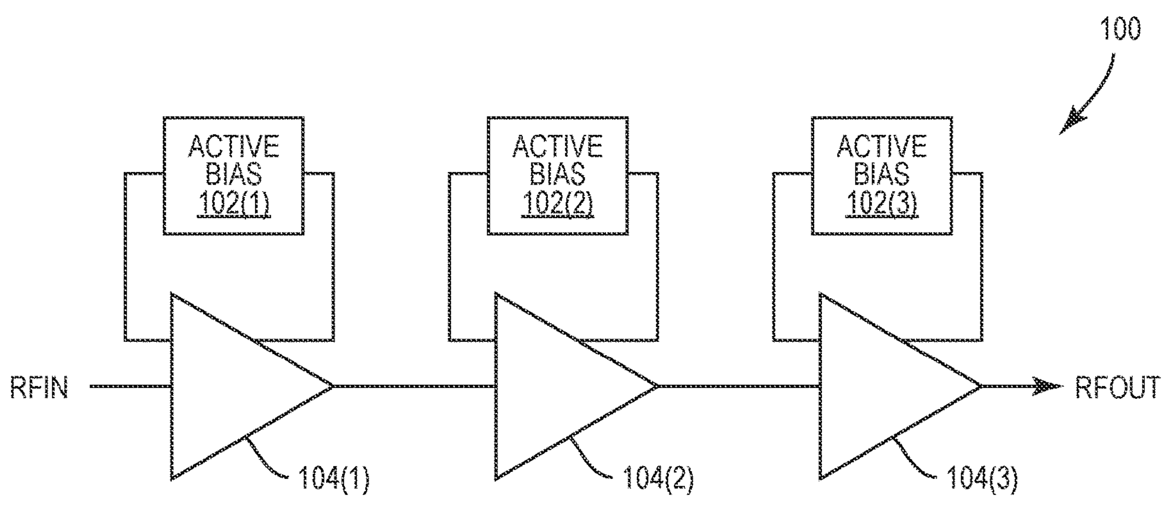
FIG. 1 is a block diagram of a conventional power amplifier chain having active bias as a first-order approach to temperature-induced droop.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element, or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include systems and methods for thermal droop compensation in power amplifiers. In particular, exemplary aspects of the present disclosure contemplate adding a droop compensation circuit to a temperature-sensitive active bias circuit in a power amplifier chain. The droop compensation circuit relies on current mirroring to draw a trigger current that may be used by a correction circuit to create an additional bias signal that offsets temperature-induced droop in the power amplifier. Variations contemplate where the bias signal is injected within the power amplifier chain and what form the correction circuit may take (e.g., an attenuator, a variable gain amplifier (VGA), or the like). By compensating for temperature droop in this fashion, rapid pulsing signals that generate rapid pulses of heat may be transmitted across an effectively linear power amplifier chain without having to deal with droop effects.

Before addressing particular aspects of the present disclosure, a brief overview of a conventional amplifier chain is provided with reference to FIG. 1, along with an explanation of sources of temperature droop. A discussion of exemplary aspects of the present disclosure that provide an improved droop compensation system begins below with reference to FIG. 2.

In this regard, FIG. 1 is a block diagram of a conventional power amplifier chain 100 having active bias circuits 102(1)-102(3) associated with respective power amplifiers 104(1)-104(3) as a first-order approach to temperature-induced droop. Specifically, a signal to be transmitted is presented at an input node RFIN and amplified by the power amplifiers 104(1)-104(3). The amplified signal is output at an output node RFOUT and may be filtered and transmitted through an antenna (not shown) as is well understood. In some wireless systems, such as wireless local area networks (WiLAN) or cellular base stations, the signal to be transmitted comes in rapid pulses (e.g., typically less than a microsecond). Current amplifier technologies generate heat when a signal is amplified. The rapid pulses likewise generate rapid surges of heat in the circuitry. When transistors within the power amplifiers 104(1)-104(3) are subjected to heat, the transistors may experience a thermal droop, where operation is no longer flat as desired. In particular, for heterojunction bipolar transistors (HBTs), the power amplifiers 104(1)-104(3) may experience a one millivolt drop per degree Celsius (1 mV/° ° C.) change.

Traditional power amplifier chains 100 may use the active bias circuits 102(1)-102(3) to provide a fixed current bias signal to the power amplifiers 104(1)-104(3). While effective as a first-order thermal droop correction, the rapid pulses of some wireless protocols means that this first-order solution may not be sufficient in all cases.

Figure 2:
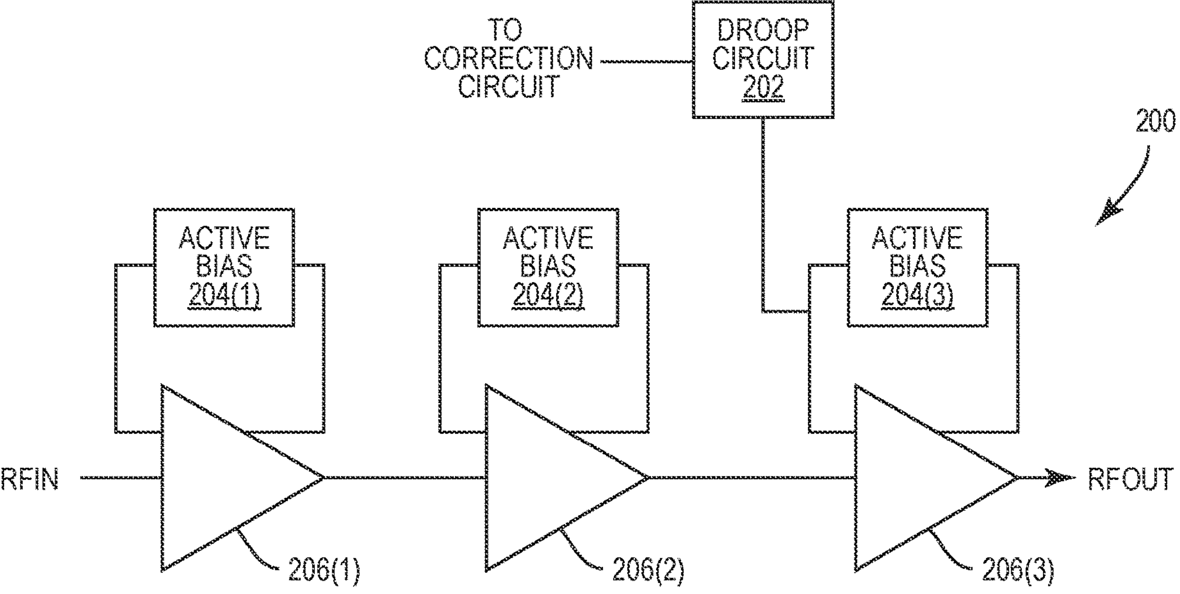
FIG. 2 is a block diagram of a power amplifier chain having a droop circuit attached to an active bias circuit according to exemplary aspects of the present disclosure that provides a signal to a correction circuit for fast corrections to temperature-induced droop.

Exemplary aspects of the present disclosure provide an additional droop circuit that may control a correction circuit to provide additional thermal droop correction for an amplifier chain, as better illustrated in FIG. 2.

In this regard, FIG. 2 is a block diagram of a power amplifier chain 200 having a droop circuit 202 attached to an active bias circuit 204(3). More specifically, the power amplifier chain 200 includes power amplifiers 206(1)-206(3), each having a respective active bias circuit 204(1)-204(3). A signal from the active bias circuit 204(3) is used by the droop circuit 202 to determine a change in operation of the power amplifier 206(3) indicative of a temperature change to produce a trigger signal that is used by a correction circuit (not shown) to adjust an operating condition in the power amplifier chain 200 to offset the droop caused by the temperature change. The addition of the droop circuit 202 and the correction circuit provides fast corrections to temperature-induced droop.

Figure 3:
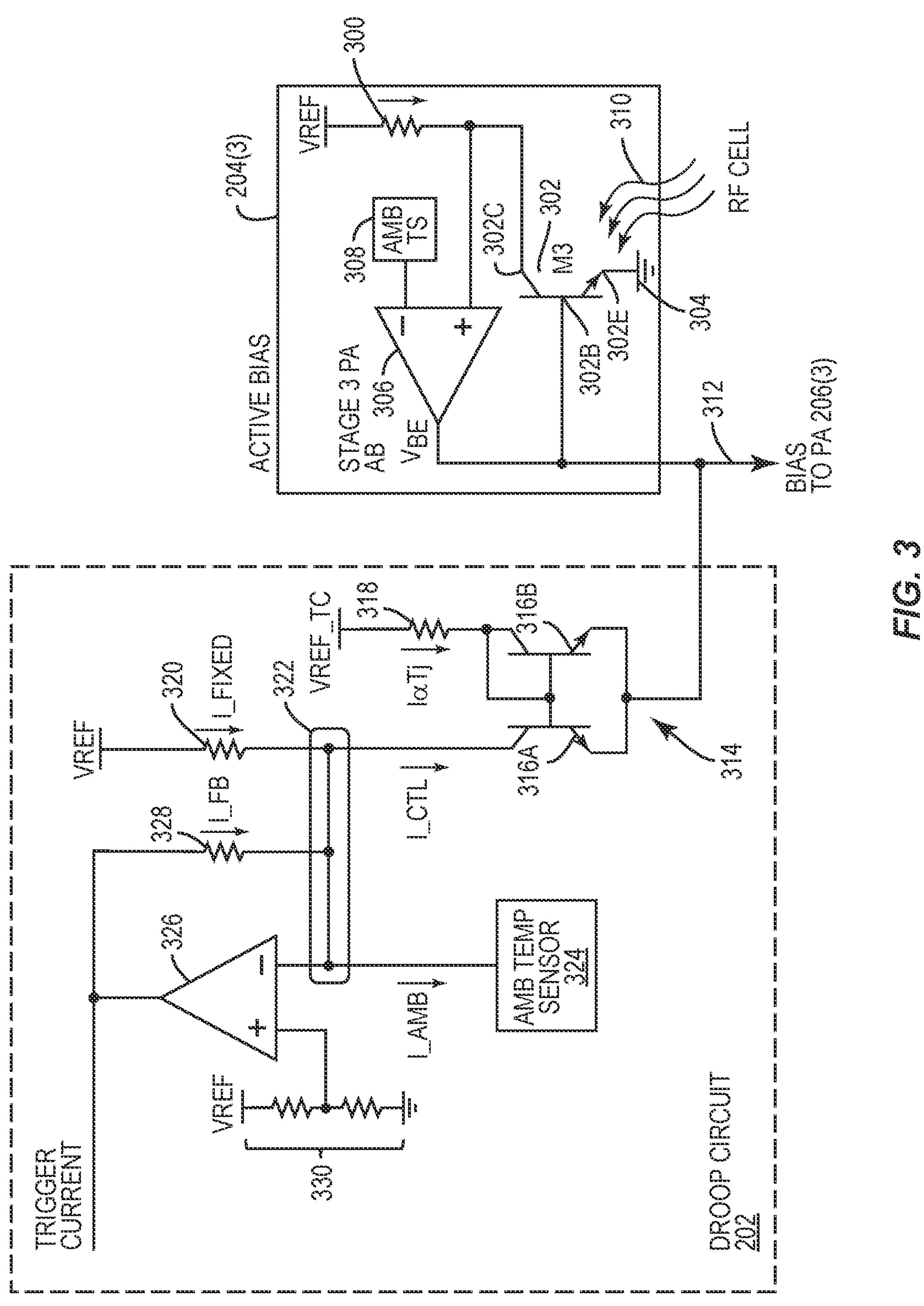
FIG. 3 is a circuit diagram of an active bias circuit and a droop circuit according to the present disclosure attached thereto.

More details about the active bias circuit 204(3) and the droop circuit 202 are provided in FIG. 3, which provides a circuit diagram of the active bias circuit 204(3) and the droop circuit 202. In particular, the active bias circuit 204(3) is coupled to a reference voltage (VREF) at a resistor 300. Current flows through the resistor 300 to a collector 302C of a transistor 302. An emitter 302E of the transistor 302 is coupled to ground 304. An operational amplifier (op-amp) 306 has a negative input coupled to an ambient temperature sensor 308. The ambient temperature sensor 308 may be distantly located and unaffected by transient temperature fluctuations in the power amplifier chain 200. As such, the value at the negative input should be relatively constant. However, the transistor 302 is positioned in close proximity to the power amplifiers 206(1)-206(3) (e.g., embedded therein), and temperature changes 310 at the power amplifiers 206(1)-206(3) will impact the transistor 302, causing the voltage drop between a base 302B and the emitter 302E to change. The emitter 302E is coupled to an output of the op-amp 306. Since the inputs to the op-amp 306 are relatively constant, the op-amp 306 will float to keep Vbe constant, creating a bias current 312, which is provided to the power amplifier 206(3).

The output of the op-amp 306 is also coupled to the droop circuit 202 through a common node that also couples to the base 302B. The droop circuit 202 includes a current mirror 314 formed from two transistors 316A, 316B. The transistor 316B is coupled through a resistor 318 to a temperature-controlled voltage source (VREF_TC) at the collector and base, such that the current I is proportional to the temperature Tj. A fixed current I_FIXED flows through a resistor 320 to a node 322 coupled to a collector of the transistor 316A. A current I_CTL flows from the node 322 to the collector. A second fixed current I_AMB flows out of the node 322 to an ambient temperature sensor 324. The ambient temperature sensor 324 may be the same as the ambient temperature sensor 308 or may be different and is distantly located from the power amplifier chain 200 so as to insulate it from rapid temperature changes. The node 322 is also coupled to a negative input of an op-amp 326. The output of the op-amp 326 provides a feedback current I_FB to the node 322 through a resistor 328 and a trigger current or trigger signal to a correction circuit (not shown in FIG. 3). The positive input of the op-amp 326 is kept constant by a voltage divider circuit 330 coupled to the voltage source VREF.

When the transistor 302 begins to droop, the bias current 312 begins to flow, which pulls current through the current mirror 314. The current from VREF_TC is relatively constant, so the current I_CTL flows to match the draw. Since the current I_CTL flows from the node 322, and the currents I_AMB and I_FIXED are fixed, the current I_FB flows into the node 322 to compensate. When the current I_FB flows, the trigger current also flows and triggers the correction circuit.

The present disclosure particularly contemplates that the transistors described above are HBTs, but the concepts of the present disclosure may be extended to other sorts of transistors with appropriate modifications.

Figure 4A:
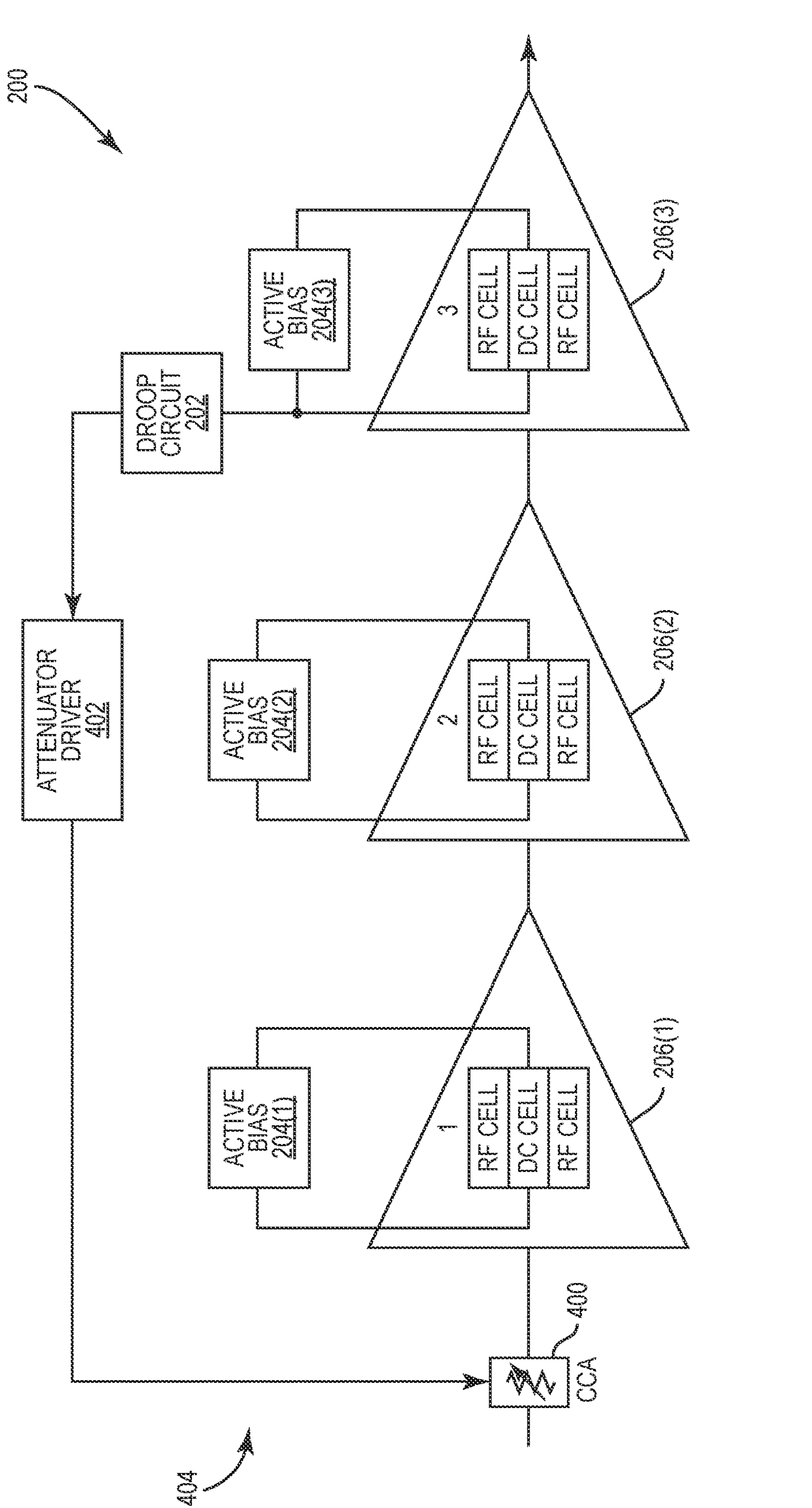
FIG. 4A is a block diagram of a droop correction system according to a first aspect of the present disclosure, where the droop circuit is coupled to an attenuator correction circuit in the amplifier chain.
Figure 4B:
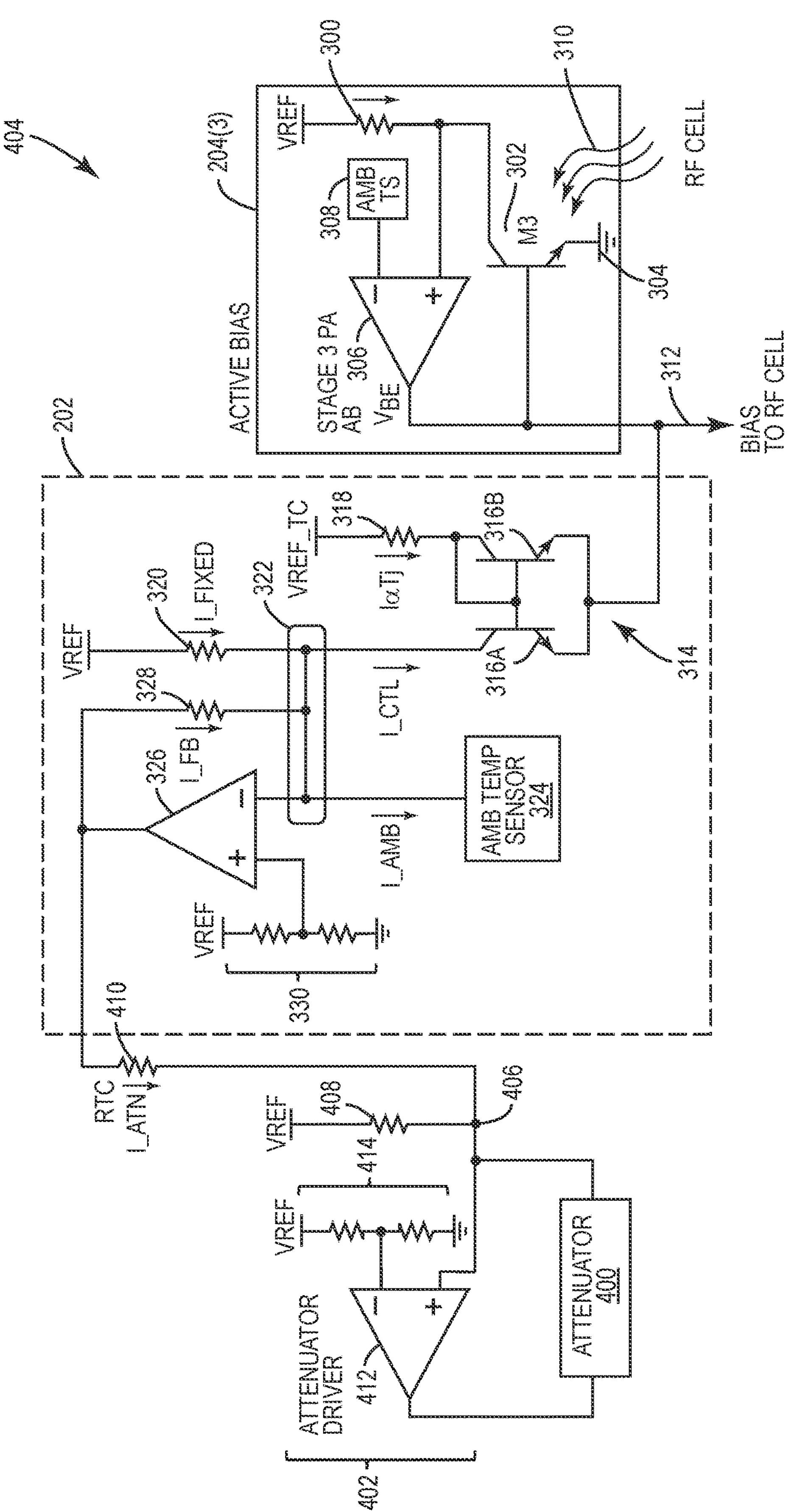
FIG. 4B is a circuit diagram of the droop correction system of FIG. 4A.
Figure 4C:
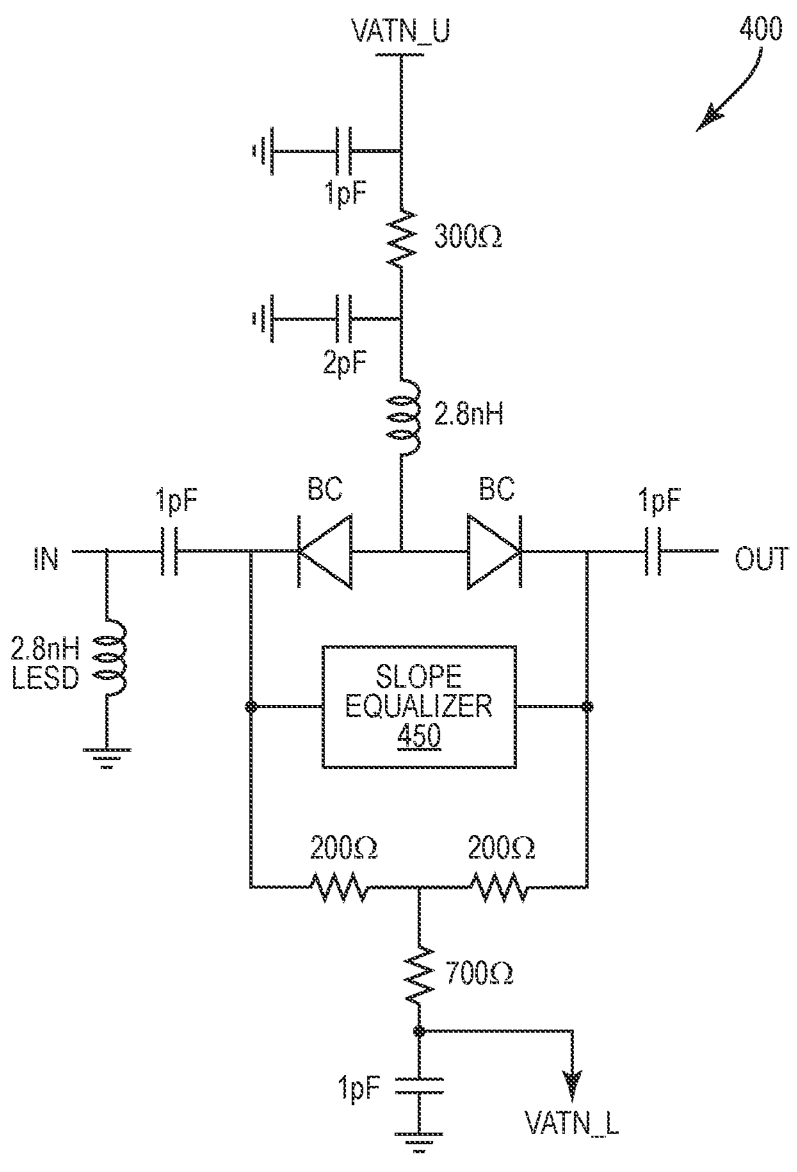
FIG. 4C is a circuit diagram of an attenuator that may be used in the droop correction system of FIG. 4A.
Figure 4D:
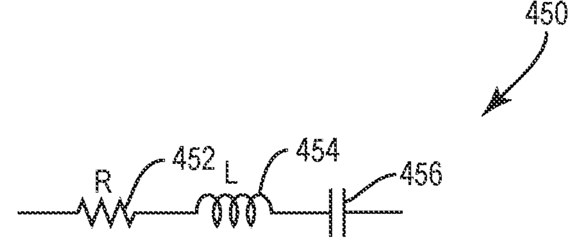
FIG. 4D is a circuit diagram of a slope equalizer in the attenuator of FIG. 4C.
Figure 4E:
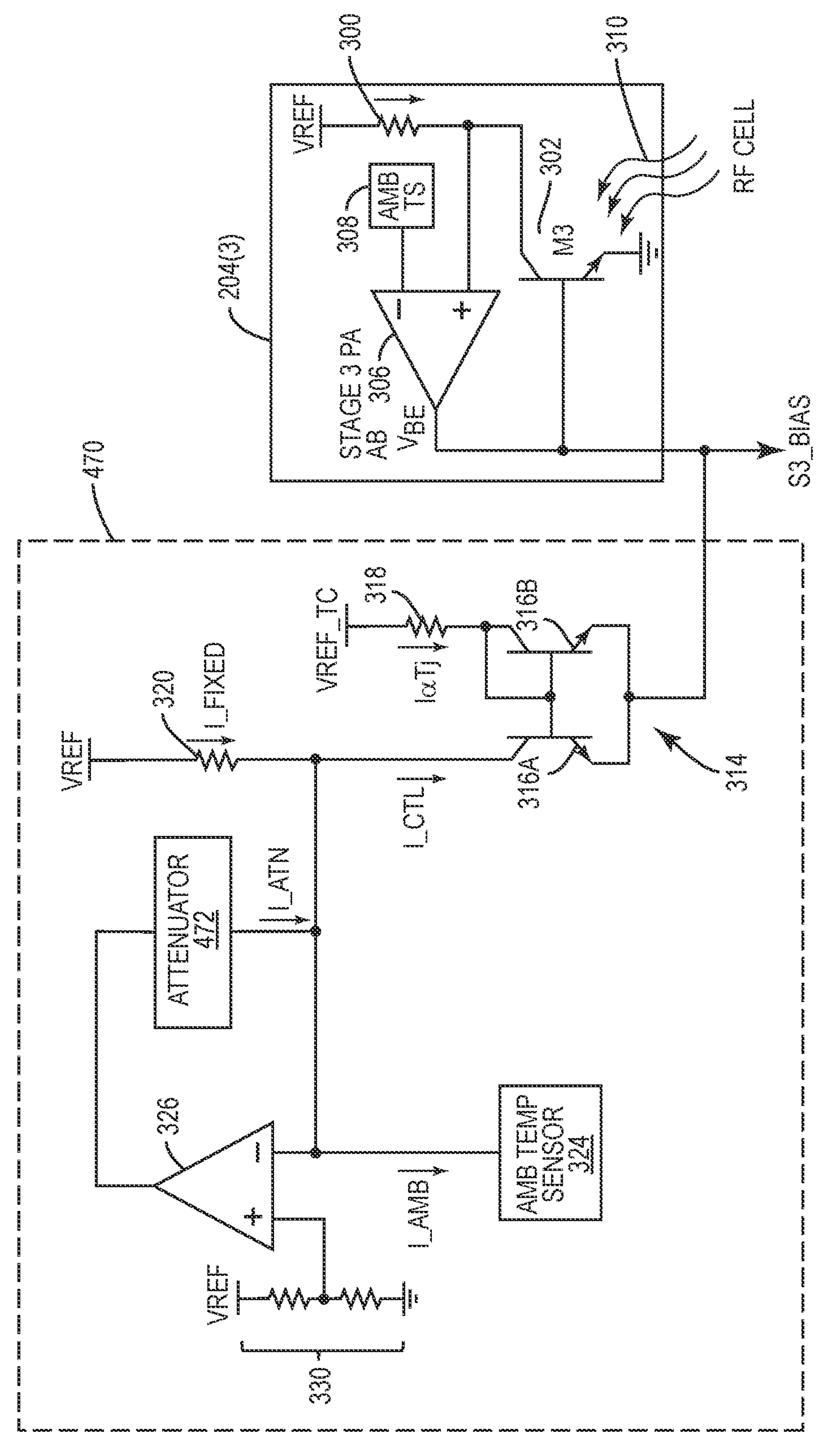
FIG. 4E is a circuit diagram of a single operational amplifier that may be used as an attenuator controller in the droop correction system of FIG. 4A.
Figure 5A:
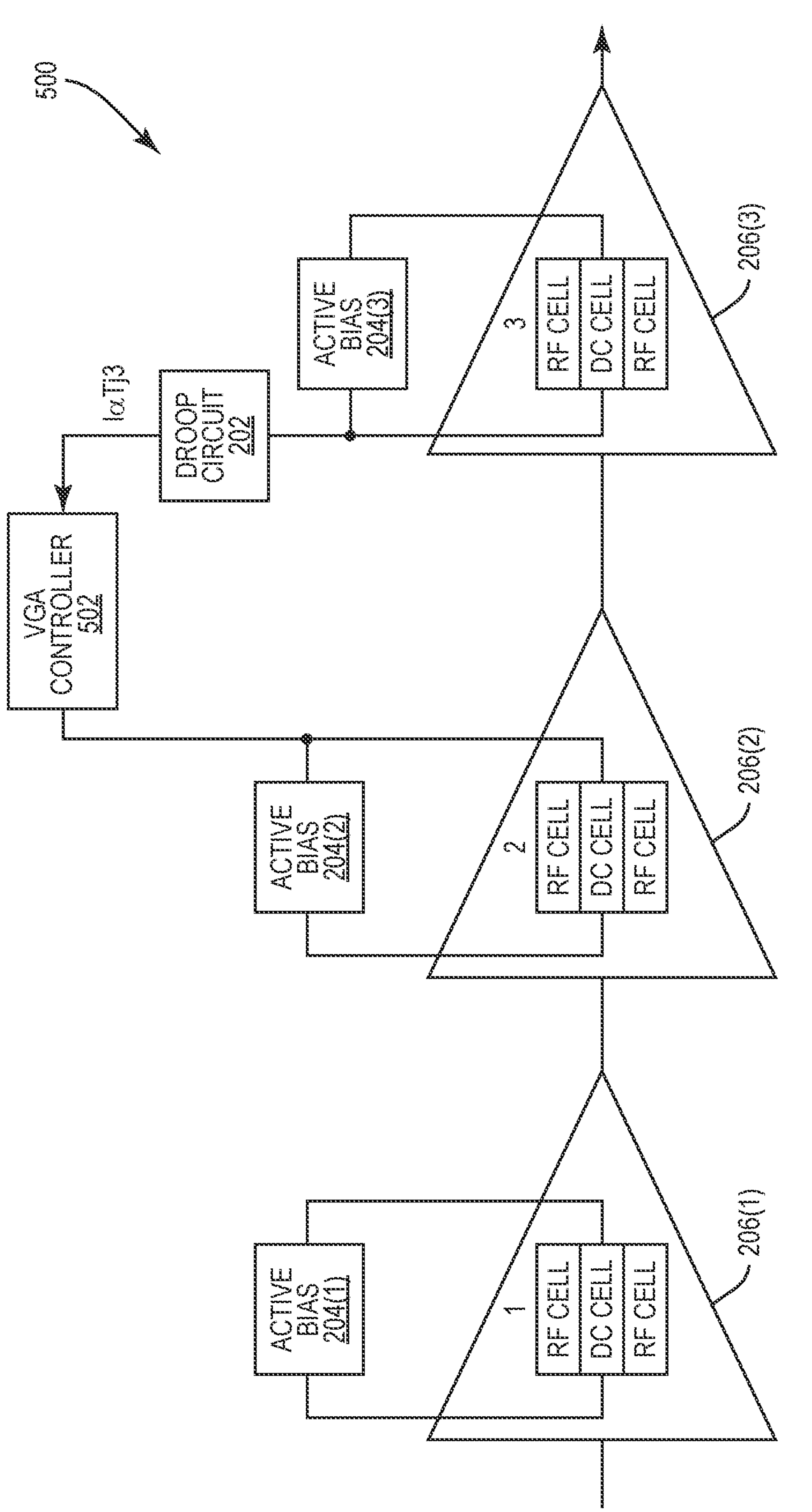
FIG. 5A is a block diagram of a second aspect of the present disclosure where the droop circuit is coupled to a variable gain amplifier (VGA) in the amplifier chain.
Figure 5B:
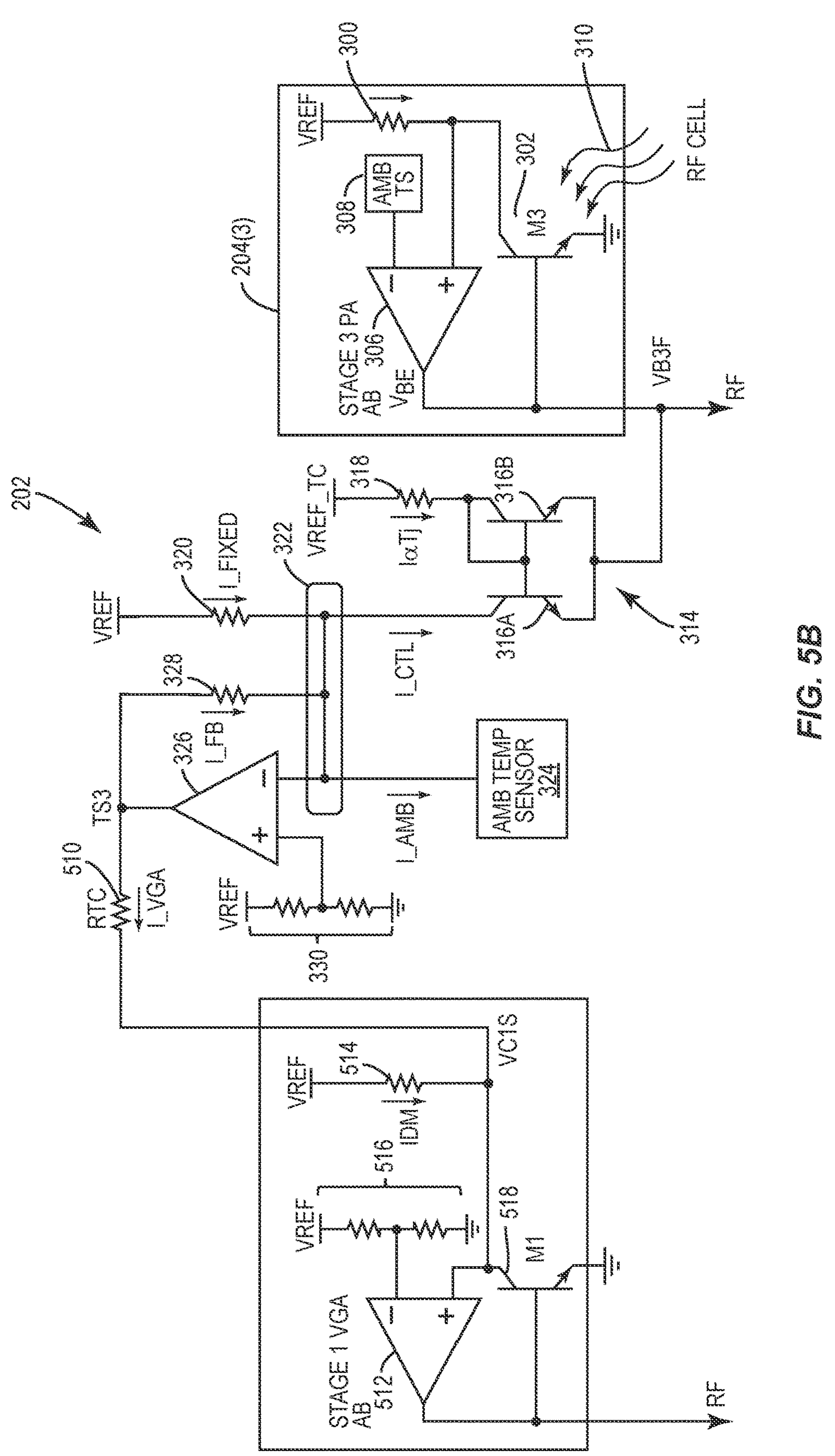
FIG. 5B is a circuit diagram of the droop correction system of FIG. 5A.
Figure 6:
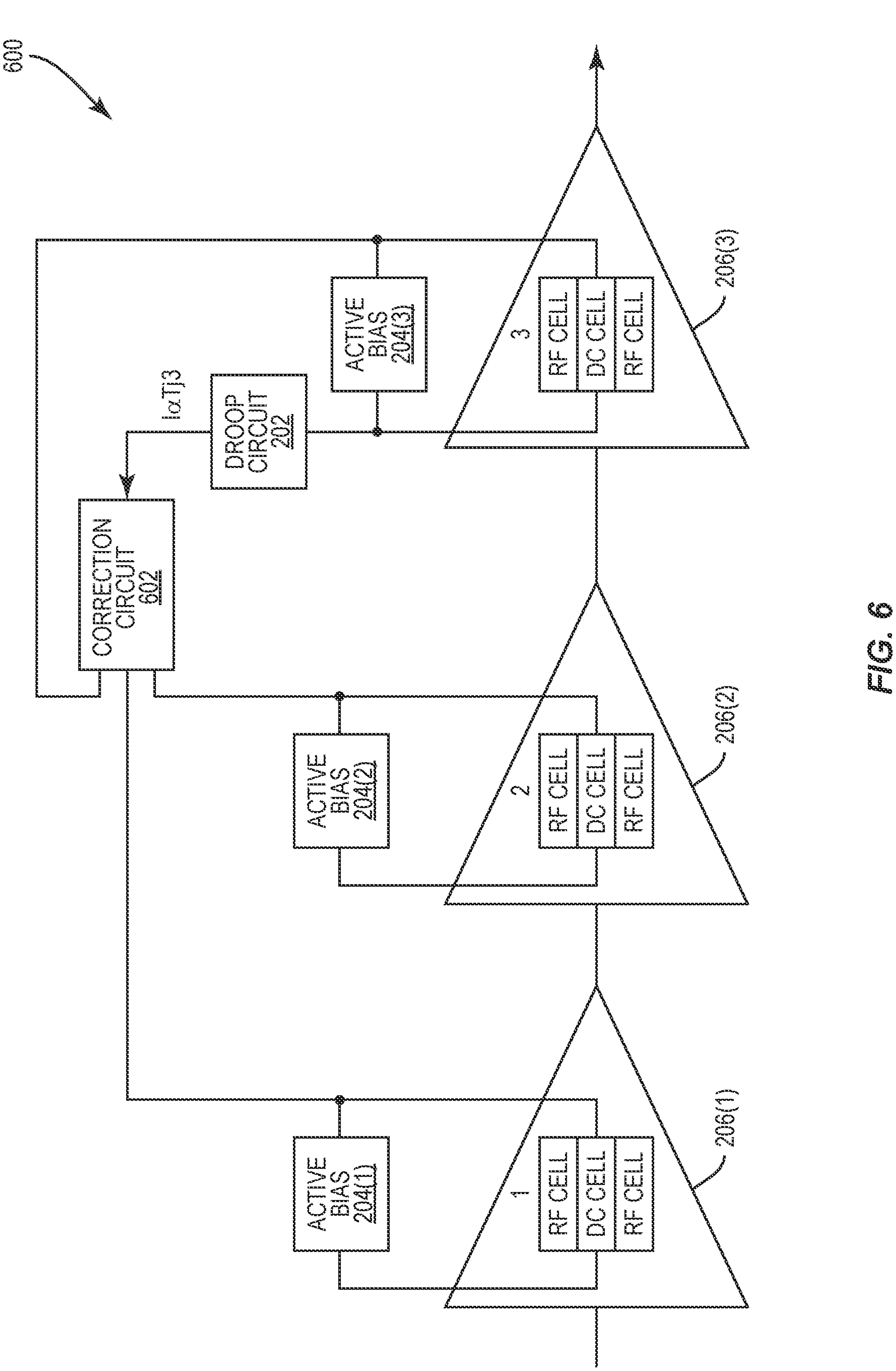
FIG. 6 is a block diagram showing various places where droop correction may be applied in an amplifier chain.

There are a variety of different types of correction circuits, and these are explored in FIGS. 4A-5B, and other variations are shown in FIG. 6. The method used to compensate for temperature droop is set forth with reference to FIG. 7.

In this regard, one possible correction circuit in a droop correction system 404 is an attenuator 400, as illustrated in FIG. 4A, where the attenuator 400 is positioned before a power amplifier 206(1) in the amplifier chain 200. The droop circuit 202 may send a signal to a correction circuit in the form of an attenuator controller or attenuator driver 402, as better shown in FIG. 4B, which is a circuit diagram of the droop correction system 404 of FIG. 4A. Within the attenuator driver 402, VREF may be coupled to a node 406 through a resistor 408. The trigger current I_ATN flows to the node 406 through a resistor 410. Collectively, the current from VREF and I_ATN act on the positive input of an op-amp 412. The negative input is coupled to VREF through a voltage divider 414, and the output of the op-amp 412 is coupled to the attenuator 400.

FIG. 4C provides a circuit diagram of the attenuator 400. While values are shown for the particular elements within the attenuator 400, it should be appreciated that the present disclosure is not so limited, and variations may be made as needed.

FIG. 4D is a circuit diagram of a slope equalizer 450 in the attenuator 400 of FIG. 4C. Specifically, the slope equalizer 450 is a resistor 452 in series with an inductor 454 and a capacitor 456, which will resonate based on the values of these elements at a frequency Fmax.

It is also possible to integrate the correction circuit into the droop circuit, as is better seen in FIG. 4E. Specifically, a droop circuit 470 may include an attenuator 472 as part of the feedback for the op-amp 326. Integration of the correction circuit in the form of the attenuator 472 within the droop circuit 470 may shrink overall size and simplify certain aspects of the design.

While using an attenuator is one approach to correcting the droop, the present disclosure is not so limited. It is also possible to use a variable gain amplifier (VGA), as shown in FIGS. 5A and 5B. In particular, FIG. 5A is a block diagram of a second amplifier chain 500, similar to the amplifier chain 200 of FIG. 2, but with a VGA controller 502 instead of the attenuator driver 402. More details of the VGA controller 502 are provided in FIG. 5B.

In particular, the signal from the op-amp 326 passes through a resistor 510 to a positive input of a VGA 512. The VGA 512 may be part of the active bias circuit 204(1). A voltage supply VREF is also coupled to the positive input of the VGA 512 through a resistor 514. A voltage divider 516 may also couple VREF to the negative input of the VGA 512. A transistor 518 may also hold the positive input at a desired level while being responsive to heat variations similar to the transistor 302. The output of the VGA 512 provides a bias signal to, for example, the first power amplifier 206(1).

While the amplifier chain 500 contemplates that the VGA 512 provides a correction at the first power amplifier 206(1), the present disclosure is not so limited and, as illustrated in FIG. 6, an amplifier chain 600 may have a correction circuit 602 that provides a correction signal to one or more of the active bias circuits 204(1)-204(3). That is, the correction signal may be provided to only one of the active bias circuits 204(1)-204(3), two, or all three as needed or desired.

Figure 7:
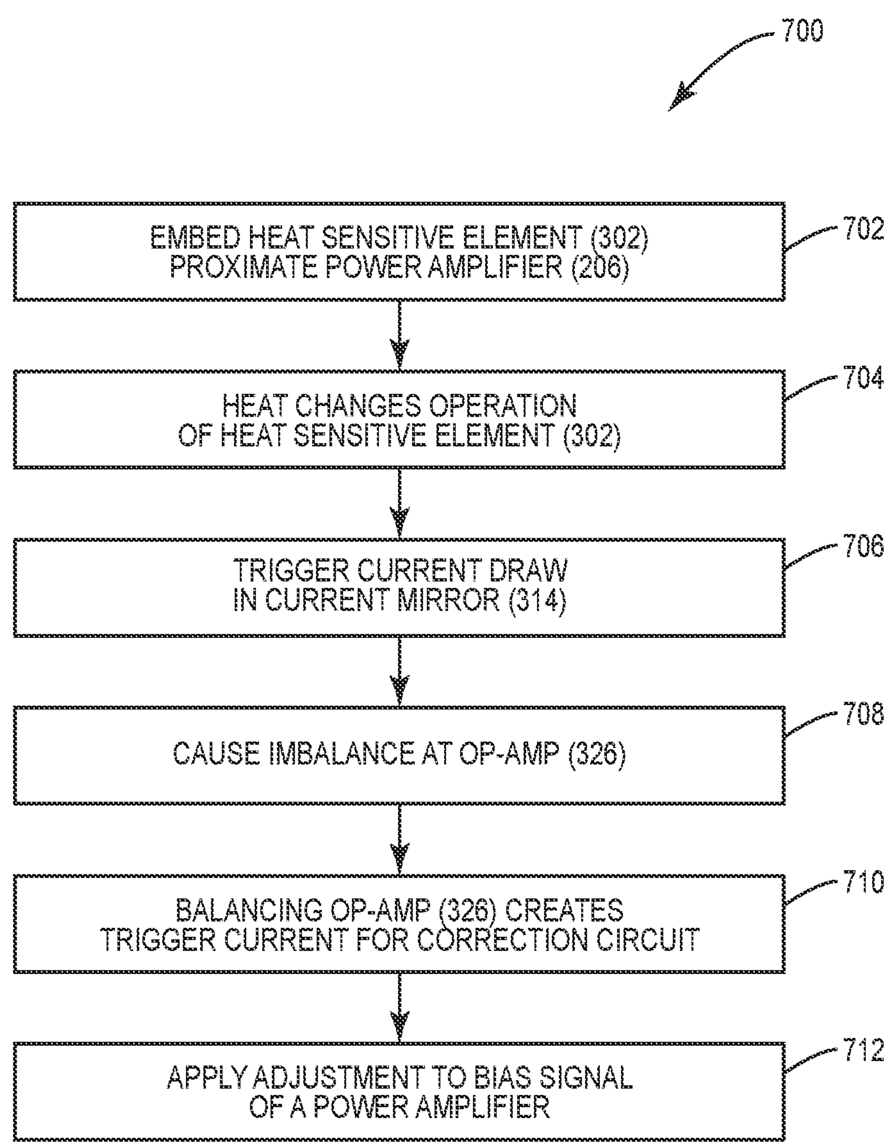
FIG. 7 is a flowchart illustrating an exemplary process for providing droop correction to an amplifier chain.

FIG. 7 is a flowchart illustrating an exemplary process 700 for providing droop correction to an amplifier chain 200 or the like. In particular, the process 700 begins by embedding a heat-sensitive element (e.g., transistor 302) proximate power amplifiers 206 (block 702). As shown above, the transistor 302 is proximate to the power amplifier 206(3) but may be otherwise positioned as desired so long as the heat-sensitive element is responsive to fast heat pulses caused by pulsed transmissions. The heat changes operation of the heat-sensitive element (302) (block 704), such as by creating a thermal droop in Vbe of the transistor 302. Change in operation triggers a current draw in a current mirror 314 (block 706). This current draw causes an imbalance at an op-amp 326 (block 708). Balancing this imbalance at the op-amp 326 creates the trigger current for the correction circuit (block 710). The correction circuit then applies an adjustment to a bias signal of a power amplifier 206 (block 712).

Figure 8:
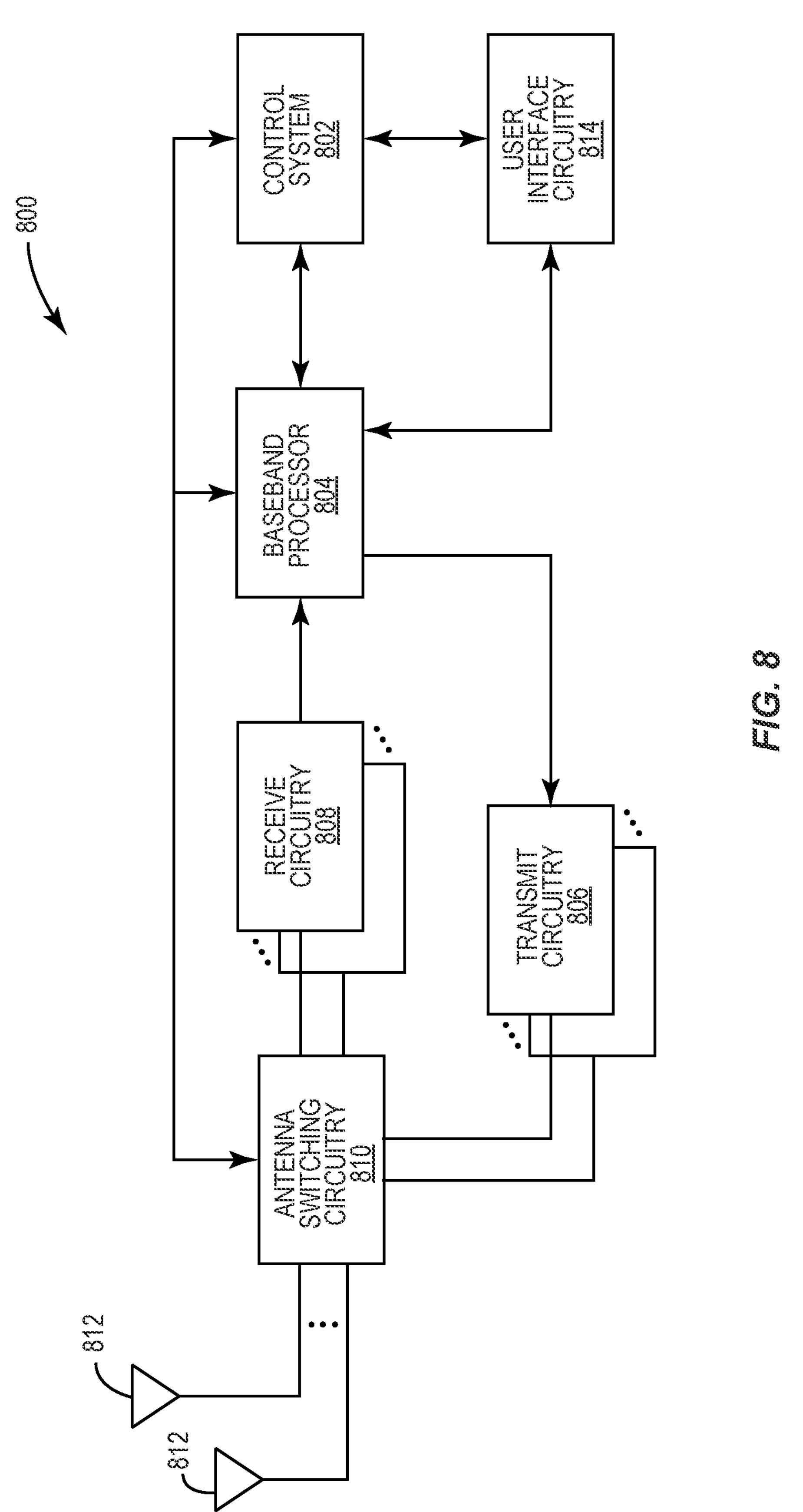
FIG. 8 is a block diagram of a wireless transceiver system, which may include the droop circuit of FIG. 2 according to the present disclosure.

With reference to FIG. 8, the concepts described above may be implemented in various types of user elements 800, such as mobile terminals, smart watches, tablets, computers, navigation devices, access points, and like wireless communication devices that support wireless communications, such as cellular base stations, wireless local area network (WiLAN), Bluetooth, and near field communications. The user elements 800 will generally include a control system 802, a baseband processor 804, transmit circuitry 806, receive circuitry 808, antenna switching circuitry 810, multiple antennas 812, and user interface circuitry 814. In a non-limiting example, the control system 802 can be a field-programmable gate array (FPGA) or an application-specific integrated circuit (ASIC), as an example. In this regard, the control system 802 can include at least a microprocessor(s), an embedded memory circuit(s), and a communication bus interface(s). The receive circuitry 808 receives radio frequency signals via the antennas 812 and through the antenna switching circuitry 810 from one or more base stations. A low noise amplifier and a filter of the receive circuitry 808 cooperate to amplify and remove broadband interference from the received signal for processing. Downconversion and digitization circuitry (not shown) will then downconvert the filtered, received signal to an intermediate or baseband frequency signal, which is then digitized into one or more digital streams using an analog-to-digital converter(s) (ADC).

The baseband processor 804 processes the digitized received signal to extract the information or data bits conveyed in the received signal. This processing typically comprises demodulation, decoding, and error correction operations, as will be discussed in greater detail below. The baseband processor 804 is generally implemented in one or more digital signal processors (DSPs) and ASICs.

For transmission, the baseband processor 804 receives digitized data, which may represent voice, data, or control information, from the control system 802, which it encodes for transmission. The encoded data is output to the transmit circuitry 806, where a digital-to-analog converter(s) (DAC) converts the digitally-encoded data into an analog signal, and a modulator modulates the analog signal onto a carrier signal that is at a desired transmit frequency or frequencies. A power amplifier or amplifier chain 200 will amplify the modulated carrier signal to a level appropriate for transmission and deliver the modulated carrier signal to the antennas 812 through the antenna switching circuitry 810. The multiple antennas 812 and the replicated transmit and receive circuitries 806, 808 may provide spatial diversity. Modulation and processing details will be understood by those skilled in the art.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. An amplifier chain comprising:
a power amplifier;
an active bias circuit coupled to the power amplifier, the active bias circuit comprising a heat-sensitive element;
a droop circuit separate and distinct from the active bias circuit and comprising a current mirror comprising a gate coupled to the heat sensitive element and configured to draw current responsive to heat changes in the heat-sensitive element and generate a trigger signal; and
a correction circuit separate and distinct from the active bias circuit, the correction circuit coupled to the power amplifier and the droop circuit and configured to:
receive the trigger signal; and
responsive to receipt of the trigger signal, provide a thermal droop correction to the power amplifier by adjusting an input signal of the power amplifier.

2. The amplifier chain of claim 1, wherein the heat-sensitive element comprises a transistor.

3. The amplifier chain of claim 2, wherein the transistor comprises a heterojunction bipolar transistor (HBT).

4. The amplifier chain of claim 1, wherein the correction circuit comprises a variable gain amplifier.

5. The amplifier chain of claim 1, wherein the correction circuit comprises an attenuator.

6. An amplifier chain comprising:
a power amplifier;
an active bias circuit coupled to the power amplifier, the active bias circuit comprising a heat-sensitive element;
a droop circuit coupled to the heat-sensitive element, the droop circuit comprising a current mirror configured to draw current responsive to changes in the heat-sensitive element and generate a trigger signal, wherein the droop circuit further comprises an operational amplifier (op-amp) coupled to the current mirror through a common node, wherein an output of the op-amp is configured to generate the trigger signal; and a correction circuit coupled to the power amplifier and the droop circuit and configured to:

receive the trigger signal; and responsive to receipt of the trigger signal, provide a thermal droop correction to the power.

7. The amplifier chain of claim 6, wherein the droop circuit further comprises an ambient temperature sensor coupled to the op-amp.

8. The amplifier chain of claim 6, wherein the droop circuit further comprises a voltage divider coupled to a reference voltage and an input of the op-amp.

9. The amplifier chain of claim 1, wherein the current mirror comprises two transistors.

10. The amplifier chain of claim 6, wherein the correction circuit comprises an attenuator coupled to the op-amp in the droop circuit.

11. A method of correcting thermal droop in an amplifier chain, comprising:

responsive to heat changes in a heat-sensitive element caused by a proximate power amplifier, triggering a current draw through a gate in a current mirror coupled to the heat-sensitive element by the gate;

causing a voltage imbalance between inputs of an operational amplifier (op-amp);

responsive to the voltage imbalance creating a trigger current at the op-amp for a correction circuit; and responsive to the trigger current, changing an input signal for the proximate power amplifier with the correction circuit.

12. The method of claim 11, further comprising detecting the heat changes in the heat-sensitive element.

13. The method of claim 12, wherein detecting the heat changes in the heat-sensitive element comprises generating a base-to-emitter voltage drop change across terminals of a heterojunction bipolar transistor (HBT).

14. The method of claim 11, wherein changing the input signal comprises using to an attenuator coupled to the proximate power amplifier.

15. The method of claim 14, further comprising adjusting a bias signal to the proximate power amplifier with the attenuator.

16. The method of claim 11, wherein changing the input signal comprises using a variable gain amplifier coupled to the proximate power amplifier.

17. The method of claim 16, further comprising adjusting a bias signal to the proximate power amplifier with the variable gain amplifier.

18. A wireless communication device comprising:

an amplifier chain comprising:

a power amplifier;

an active bias circuit coupled to the power amplifier, the active bias circuit comprising a heat-sensitive element;

a droop circuit coupled to the heat-sensitive element, the droop circuit comprising a current mirror configured to draw current responsive to heat changes in the heat-sensitive element and generate a trigger signal, wherein the droop circuit further comprise an operational amplifier (op-amp) coupled to the current through a common node, wherein an output of the op-amp is configured to generate the trigger signal; and a correction circuit coupled to the power amplifier and the droop circuit and configured to:

receive the trigger signal; and responsive to receipt of the trigger signal, provide a thermal droop correction to the power amplifier.

* * * * *